United States Patent
Bright et al.

[19]

[11] Patent Number: 6,127,726
[45] Date of Patent: Oct. 3, 2000

[54] CAVITY DOWN PLASTIC BALL GRID ARRAY MULTI-CHIP MODULE

[75] Inventors: William T. Bright, Fort Collins, Colo.; Donald C. Foster, Mesa, Ariz.

[73] Assignee: LSI Logic Corporation, Milpitas, Calif.

[21] Appl. No.: 09/321,298

[22] Filed: May 27, 1999

[51] Int. Cl.$^7$ .................................................. H01L 23/52
[52] U.S. Cl. .................. 257/691; 257/723; 257/678; 257/693; 257/712; 257/703
[58] Field of Search ......................... 257/691, 697, 257/777, 723, 678, 693, 712, 706, 703

[56] References Cited

U.S. PATENT DOCUMENTS 5,239,198  8/1993  Lin et al. ................................ 257/693
5,869,894  2/1999  Degani et al. ......................... 257/723

*Primary Examiner*—Mahshid Saadat
*Assistant Examiner*—Jhihan B Clark

[57] ABSTRACT

A circuit assembly comprising a substrate, a first set of contacts, a second set of contacts, and a third set of contacts. Also, a plurality of electrically conductive lines located on the substrate providing electrical connection between the first set of contacts, the second set of contacts, and the third set of contacts, wherein the plurality of electrically conductive lines are configured such that data can be transferred between the first set of contacts, the second set of contacts and the third set of contacts. A first die is electrically connected to the first set of contacts, and a molding compound surrounds the substrate, wherein the molding compound is formed such that the second set of contacts is exposed allowing electrical connection of the second die to the second set of contacts.

21 Claims, 4 Drawing Sheets

CAVITY DOWN PLASTIC BALL GRID ARRAY MULTI-CHIP MODULE

BACKGROUND OF THE INVENTION

1. Technical Field

The present invention relates to semiconductor devices and in particular to packaging of semiconductor devices. Still more particularly, the present invention relates to an integrated circuit package integrating multiple dies on a ball grid array substrate.

2. Description of the Related Art

A number of different packaging technologies exist for attaching semiconductor devices to a printed circuit board (PCB). The three packaging technologies include a ball grid array (BGA), chip scale package (CSP), and direct chip attach (DCA). BGA is an older technology relative to CSP and DCA. Theoretically speaking, the most effective packaging technology is DCA. DCA involves the direct attachment of the chip to the PCB without a package, such as a solder-bumped flip chip or wire bonding chip on the board. Issues with respect to the cost of supplying a known good die (KGD) and corresponding fine line and spacing PCB are present. As a result, CSP's and BGA's are the main types of packaging technology used in attaching semiconductors to PCB's.

As the demand for high speed, high performance, and low cost, semiconductor devices are continually increasing in integration density, packages have become more complex. For example, packages are present in which multiple chips are placed within a single package. These types of chips are also referred to as multi-chip modules. A multi-chip module (MCM), also referred to as a multi-chip package (MCP), contains two or more die in a single package. These multi-chip modules may contain microprocessor circuits along with peripheral circuits, such as memory management units, input/output controllers, peripheral component interconnect/interface (PCI) controllers, and application specific integrated circuits (ASIC).

The most common MCM is a "side-by-side" MCM. In this type of MCM, two or more die are mounted next to each other on the mounting surface of either a plastic molded package, cavity package, or a chip on board (COB) assembly. The die may be mounted directly to the mounting surface or be mounted on a substrate, which is itself mounted to the principle-mounting surface. Inner connections among these die and electrical leads are commonly made via wire bonding. Other MCM's involve placing two or more die on top of each other and securing the "stack" of die in a package.

One problem with placing multiple die within a single package is with additional die, additional possible defects are possible within the package. If one die within a MCM is defective, the entire chip must then be discarded. Thus, although MCM's have provided increased functionality, yields have decreased as a result of the increased chances for defects.

Thus, it would be advantageous to have an improved method and apparatus for placing multiple die in a chip package.

SUMMARY OF THE INVENTION

The present invention overcomes problems associated with previous packaging designs through an improved package architecture. The present invention provides a circuit assembly comprising a substrate, a first set of contacts, a second set of contacts, and a third set of contacts. Also, a plurality of electrically conductive lines located on the substrate providing electrical connection between the first set of contacts, the second set of contacts, and a third set of contacts, wherein the plurality of electrically conductive lines are configured such that data can be transferred between the first set of contacts, the second set of contacts, and the third set of contacts. A first die is electrically connected to the first set of contacts, and an enclosure encloses the substrate, wherein the enclosure is formed such that the second set of contacts is exposed allowing electrical connection of the second die to the second set of contacts. This enclosure may be for example, a copper stiffener or a molding compound.

A second die may be later electrically connected to the second set of contacts to provide additional functionality to the circuit assembly. The configuration of the electrically conductive lines are such that the device connected to the first set of contacts are able to access the device connected to the second set of contacts. Additionally, the third set of contacts is designed for electrical connection with signals off the circuit assembly. In this manner, devices off the circuit assembly also may access any device connected to the second set of contacts.

BRIEF DESCRIPTION OF THE DRAWINGS

The novel features believed characteristic of the invention are set forth in the appended claims. The invention itself however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
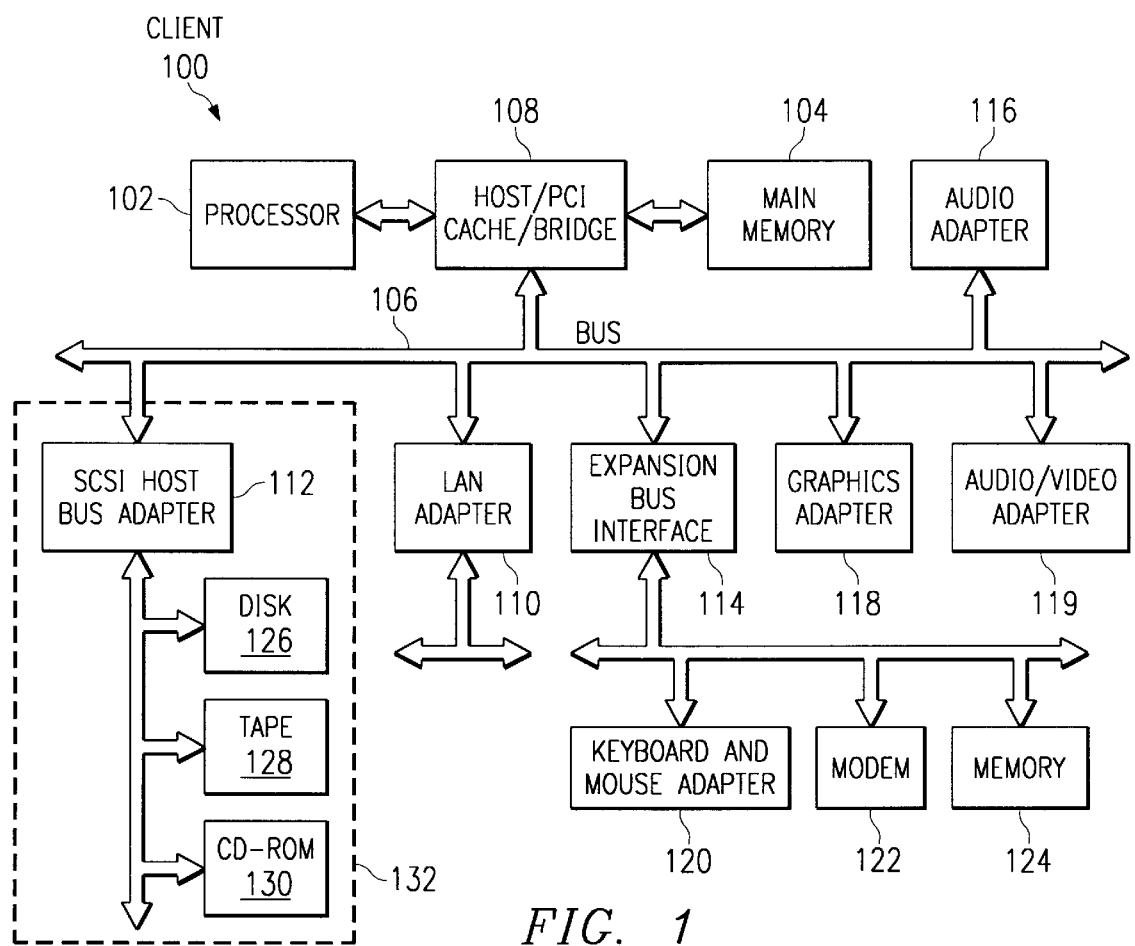
FIG. 1 is a block diagram illustrating a data processing system in which the present invention may be implemented.

With reference now to FIG. 1, a block diagram illustrates a data processing system in which the present invention may be implemented. Multi-chip modules or packages of the present invention may be implemented within data processing system 100, which is an example of a typical computer. Data processing system 100 employs a peripheral component interconnect (PCI) local bus architecture. Although the depicted example employs a PCI bus, other bus architectures such as Micro Channel and ISA may be used. Processor 102 and main memory 104 are connected to PCI local bus 106 through PCI bridge 108. PCI bridge 108 also may include an integrated memory controller and cache memory for processor 102. Additional connections to PCI local bus 106 may be made through direct component interconnection or through add-in boards. In the depicted example, local area network (LAN) adapter 110, SCSI host bus adapter 112, and expansion bus interface 114 are connected to PCI local bus 106 by direct component connection. In contrast, audio adapter 116, graphics adapter 118, and audio/video adapter 119 are connected to PCI local bus 106 by add-in boards inserted into expansion slots. Expansion bus interface 114 provides a connection for a keyboard and mouse adapter 120, modem 122, and additional memory 124. SCSI host bus adapter 112 provides a connection for hard disk drive 126, tape drive 128, and CD-ROM drive 130. Typical PCI local bus implementations will support three or four PCI expansion slots or add-in connectors.

A multi-chip module of the present invention may be implemented within data processing system 100. In particular, a multi-chip module may be located in an adapter, such as, for example, LAN adapter 110, and SCSI host bus adapter 112. A multi-chip module also may be found within other adapters, such as audio adapter 116, graphics adapter 118, and audio/video adapter 119. In accordance with the preferred embodiment of the present invention, this multi-chip module is a plastic ball grid array (PBGA) unit with an opening, exposing the substrate, in the top of the package for one or more die or devices in the chip scale packages (CSP). Of course, the die or devices may be packaged in other ways than as a CSP. For example, the die or device may be in the form of a bare die that is placed onto the substrate. The LPBGA in these examples may include a microprocessor or an ASIC, which is able to access the CSPs on the PBGA. Further, an additional feature of the present invention is that the bus within the PBGA is run such that other devices located off or externally to the multi-chip module may access the memory provided by the CSPs. For example, processor 102 and data processing system 100 or a processor and another adapter may access the memory in the PBGA.

Those of ordinary skill in the art will appreciate that the hardware in FIG. 1 may vary depending on the implementation. Other internal hardware or peripheral devices, such as flash ROM (or equivalent nonvolatile memory) or optical disk drives and the like, may be used in addition to or in place of the hardware depicted in FIG. 1. Also, the chip assembly of the present invention may be used in a multi-processor data processing system.

For example, data processing system 100, if optionally configured as a network computer, may not include SCSI host bus adapter 112, hard disk drive 126, tape drive 128, and CD-ROM 130, as noted by dotted line 132 in FIG. 1 denoting optional inclusion. As another example, data processing system 100 may be a stand-alone system configured to be bootable without relying on some type of network communication interface. As a further example, data processing system 100 may be a Personal Digital Assistant (PDA) device which is configured with ROM and/or flash ROM in order to provide non-volatile memory for storing operating system files and/or user-generated data.

The depicted example in FIG. 1 and above-described examples are not meant to imply architectural limitations as to the type of data processing system in which the present invention may be used.

Figure 2:
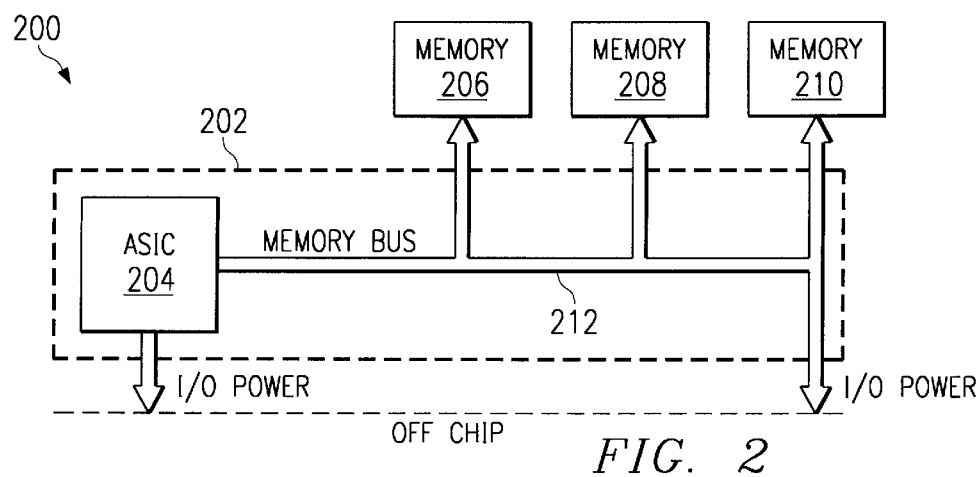
FIG. 2 is a functional block diagram of a multi-module chip depicted in accordance with a preferred embodiment of the present invention.

With reference now to FIG. 2, a functional block diagram of a multi-module chip is depicted in accordance with a preferred embodiment of the present invention. MCM 200 in this example contains a cavity down package 202, which contains a semiconductor device, such as, an ASIC 204 in this example. In addition, memories 206, 208, and 210 are attached to package 202 in this example. These memories are placed within the package through openings in the encapsulation material to be connected to various pads or conductors forming memory bus 212. In this manner, ASIC 204 may access memories 206, 208, or 210. Further, memory bus 212 includes a connection within package 202 to the PCB to allow other devices external to package 202 to access memories 206, 208 and 210. In this manner, CSPs containing memories, or other types of semiconductor devices other than memories, may be attached to bus 212 in accordance with a preferred embodiment of the present invention. In this example, ASIC 204 also includes a separate signal I/O and power ground connections in package 202 for connection to a PCB.

The processes, steps, and structures described below do not form a complete process flow for manufacturing integrated circuits or packages. The present invention can be practiced in conjunction with integrated circuit fabrication and packaging techniques currently used in the art, and only so much of the commonly practiced process steps are included as necessary for an understanding of the present invention. The figures include cross-sections of a portion of a package and are not drawn to scale, but instead are drawn to illustrate the important features of the present invention.

Figure 3:
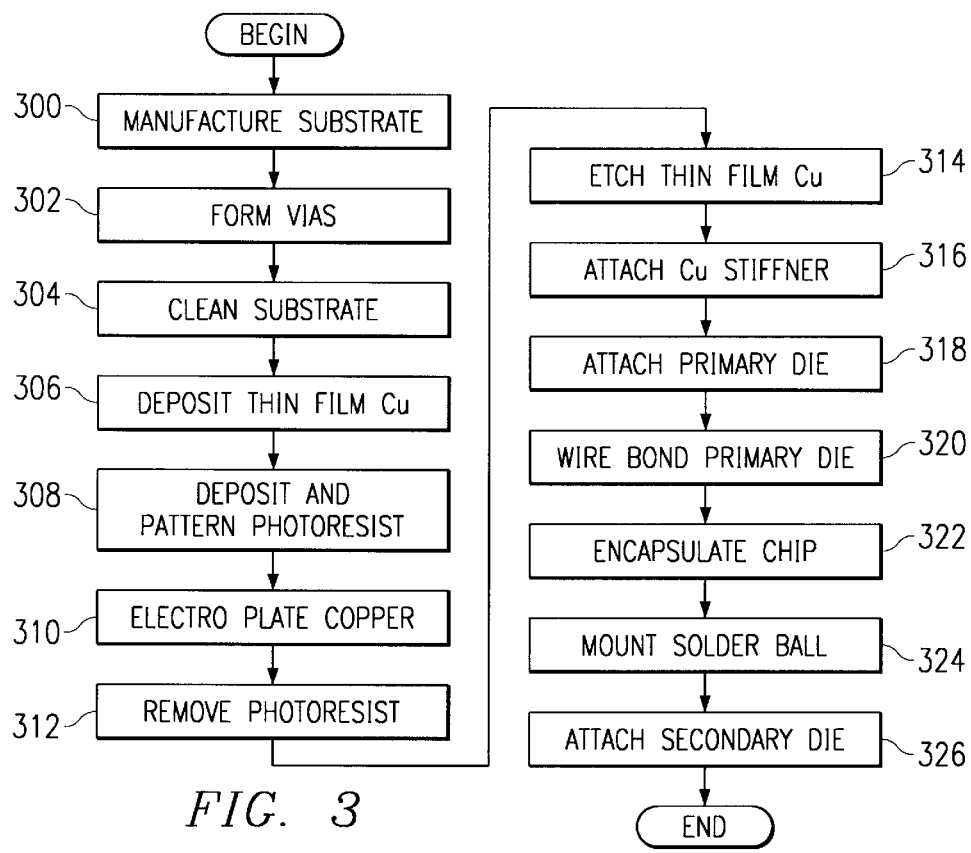
FIG. 3 is a flowchart of a process for manufacturing a chip depicted in accordance with a preferred embodiment of the present invention.

With reference now to FIG. 3, a flowchart of a process for manufacturing a chip is depicted in accordance with a preferred embodiment of the present invention. The process begins by manufacturing a substrate (step 300). In this example, the substrate is a microvia substrate. Thereafter, vias are formed in the substrate (step 302). The formation of vias begins with plasma cleaning of the substrate surface, thereafter, a photosensitive resin is spin coated and baked. The exposed films are developed and the vias are formed after final carrying. Next, the substrate is cleaned (step 304) and a thin copper film is deposited by sputtering (step 306). Thereafter, a photoresist layer is deposited in a pattern (step 308). This step provides the pattern for the various lines on the substrate to form interconnections for the primary die along with the secondary die. Further, these lines also will provide the common bus to allow the primary die to access the secondary die along with other devices off the chip. The CU traces are then formed by electroplating (step 310). Thereafter, the photoresist is stripped from the substrate (step 312). The remaining thin film copper is then etched away (step 314). Thereafter, a copper stiffener is attached to the substrate (step 316). In accordance with a preferred embodiment of the present invention, the copper stiffener has a cutout that exposes a portion of the substrate in places in which a secondary die may be electrically connected to the substrate at a later time.

A primary die is then attached to the copper stiffener via an adhesive (step 318). In this example, the primary die is an ASIC die although other types of dies, such as a processor or other integrated circuit devices may be used as a primary die. Thereafter, the primary die is wire bonded to establish an interconnection between the die and the substrate (step 320). Then, encapsulation is performed (step 322). The encapsulation step is used to encapsulate the die within a molding compound. In this example, however, the die remains exposed on the bottom side of the chip. Further, encapsulation step 322 is performed to leave a portion of the substrate exposed for attachment of one or more secondary dies. In this example, the top side of the chip is left open for the secondary dies. The opening in the chip is such that a substrate or connection mechanism for electrically connecting the secondary dies is exposed. The secondary dies may be added at a later time. For example, a secondary die may be added after the chip has been used in a data processing system.

Thereafter, the solderballs are mounted on the package (step 324). This step involves mounting the solderballs to the appropriate places on the substrate not encapsulated by the molding compound. Thereafter, conventional IR re-flow is used to attach the solderballs to the bottom of the substrate. The step of patterning the photoresists also involves forming various die bond pads. The substrate manufactured in step 300 may be a multi-layered substrate depending on the implementation.

After the solderballs have been mounted, the secondary die may be attached to the exposed portion of the substrate (step 326) with the process terminating thereafter. Step 326 also may be performed prior to mounting solderballs in step 324. The mounting of a secondary die may be performed at a number of different times. The secondary die may even be attached to the multi-chip module after the multi-chip module has been attached to a PCB. In this manner, the architecture of the present invention provides flexibility in adding additional devices, such as memory, at different times. Furthermore, secondary die meeting the required quality standards may be pre-selected and attached to a multi-chip module. As a result, yields are increased without having to rely on both a primary die and a secondary die meeting testing requirements after the package has been completed.

Figure 4:
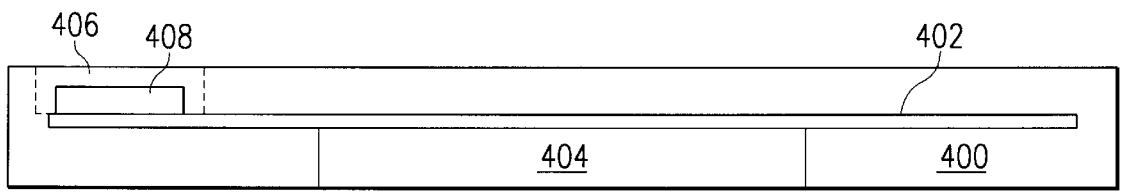
FIG. 4 is a side view of a multi-chip module depicted in accordance with a preferred embodiment of the present invention.

With reference now to FIG. 4, a side view of a multi-chip module is depicted in accordance with the preferred embodiment of the present invention. In the depicted example, the multi-chip module uses a standard PBGA core with microvias. Alternatively, a standard laminate technology using six to eight layers and possibly blind vias also may be used to implement the present invention. In this example, multi-chip module (MCM) 400 contains substrate 402, which provides the lines for electrically connecting various components. In this example, a die 404, which may be an ASIC or processor in accordance with a preferred embodiment of the present invention, is attached to substrate 402 on the bottom side of MCM 400. In this example, substrate 402 is a PBGA substrate. Also included within MCM 400 is a cavity or opening 406. This cavity or opening 406 is such that substrate 402 is exposed in an area in which contacts are provided for electrically connecting an additional device to MCM 400. For example, a chip scale package (CSP) 408, such as a memory CSP may be attached to substrate 402. In these examples, the device may be added to substrate 402 for use with die 404. An example of such a combination would include an ASIC as the primary die and a memory as a secondary die, in which the ASIC may access the memory attached to the substrate. Further, the architecture of the present invention allows for all chip connections, which allow other devices to access the secondary die. For example, a processor located off the chip also may access CSP 408. In this example, only the devices in the opening are shown to illustrate the features of the present invention.

In this example, MCM 400 is a cavity down, thermally enhanced plastic ball grid array (PBGA) package with one or more openings, such as opening 406 created in the top of the package for attaching CSPs, such as CSP 408.

A cavity package is a type of semiconductor package in which a cavity base serves as a principal mounting surface or seating plain upon which a die 404 for a device is mounted in MCM 400. The die in the cavity of the package is open and surrounded by air in this example. Several electrical leads (not shown) provide an electrical path from inside the housing to outside the housing. Some common types of cavity packages include ceramic packages, metal cans, plastic packages, and any combination thereof. A CSP includes the use of a substrate (interposer, or carrier, or substrate, or middle layer) to redistribute the pitch of peripheral array pads, which are normally very fine, as small as 0.075) to a larger pitch, such as 1.00 mm, 0.8 mm, 0.75 mm, and 0.5 mm on the printed circuit board. Typically, a CSP is a package area that is 1.5×the chip area. A number of different CSPs are present and most are designed for use with static random access memories, dynamic random access memories, flash memories, and other types of application specific integrated circuits and microprocessors.

Of course, other types of packages other than CSPs may be used as a die 404 for use in multi-chip module 400. Other types of packages that also may be used include, for example, thin small outline packages (TSOP), and thin zero outline packages (TZOP). In accordance with the preferred embodiment of the present invention, opening 404 is left open in the package after manufacturing for an ability to later add memory, such as CSP 406.

A further feature of the present invention is that CSP 406 may be accessed by other devices other than die 404 in FIG. 4. For example, a processor or other ASIC remote to MCM 400 may access the CSPs via a common bus routing system.

With this type of configuration, issues with respect to conventional MCM designs, such as KGD and bare memory die availability are avoided by using memory devices in CSP packages. This type of MCM avoids the added yield loss that generally occurs with few chip MCMs with lowered KGD requirements. This package of the present invention also is capable of handling higher power output compared to standard plastic view chip MCM designs.

With the implementation of thermally enhanced cavity down PBGA, a copper stiffener is used in the package construction. This copper plate acts a heatspreader providing a highly conductive path for spreading the heat across the top surface of the package. This improves the thermal conduction to and through the solderballs and into the PCB the packet is mounted on. It also has a major impact and improvement on the thermal convection. For the primary and secondary die, this is the prominent mechanism for heat dissipation.

In the depicted examples, the thickness of the copper stiffener should match the profile height of the secondary die or its package. The top surfaces of the copper stiffener and the secondary package should be coplanar. Optionally, a heat sink can then be mounted on the coplanar surfaces to provide additional thermal convection enhancement. Higher input/output is also provided when compared to a cavity down MCM implementation because the die is placed on the opposite side of the package.

Figure 5:
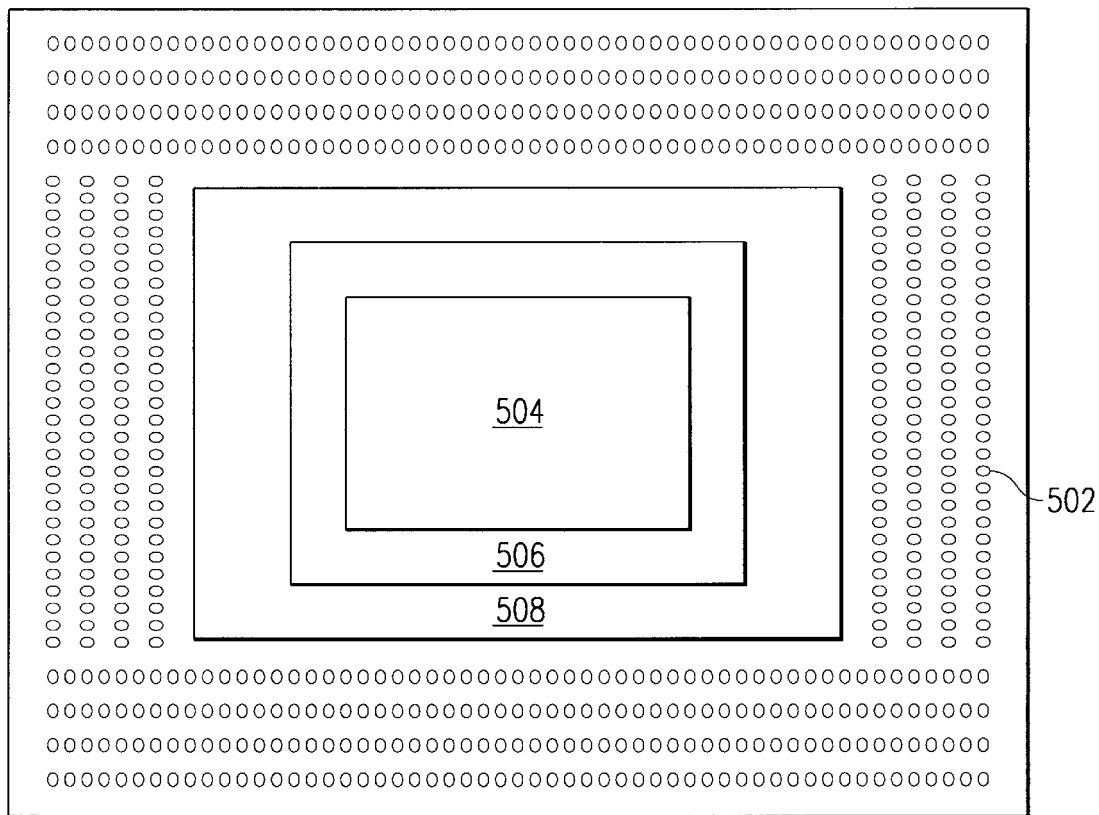
FIG. 5 is a bottom view of a multi-chip module in the form of a cavity down PBGA illustrated in accordance with a preferred embodiment of the present invention.

With reference now to FIG. 5, a bottom view of a multi-chip module in the form of a cavity down PBGA is illustrated in accordance with a preferred embodiment of the present invention. In this example, package 500 includes solderballs 502, which provide connections between package 500 and a PCB (not shown). These leads are connected to lines (not shown), which are in turn connected to die 504, which is located within cavity 506. Encapsulation of the die 504 is absent in area 508 on the topside of package 500. Area 508 is encapsulated on the bottom side of package 500 in this example. Area 508 encompasses the die and the cavity and covers this entire area on the bottom side of the chip.

Figure 6:
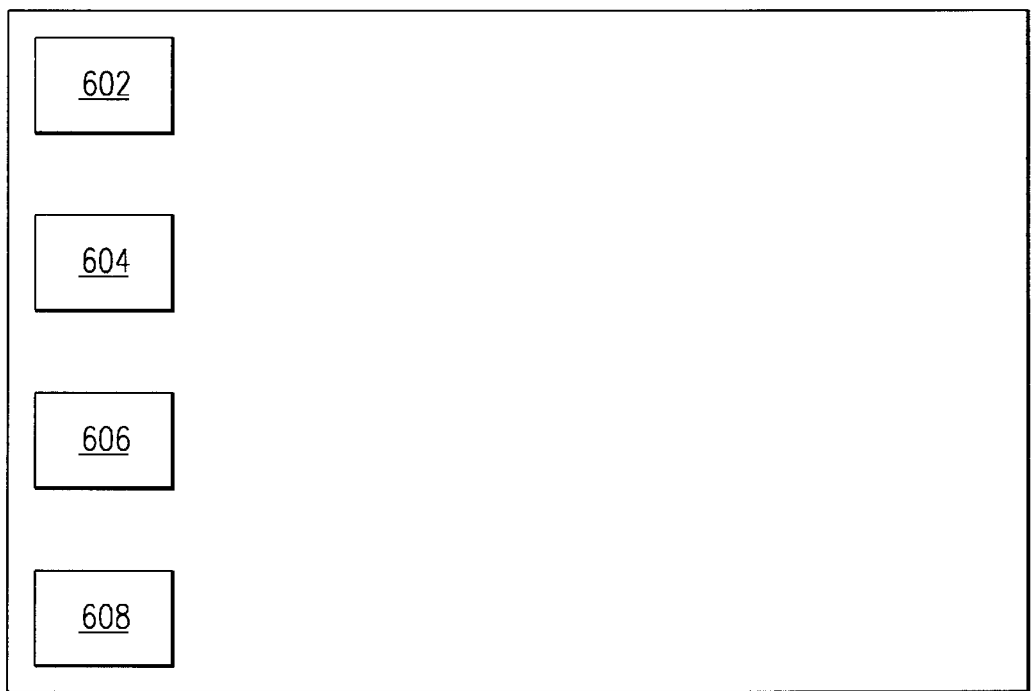
FIG. 6 is a top view of a multi-chip module depicted in accordance with a preferred embodiment of the present invention.

With reference now to FIG. 6, a top view of a multi-chip module is depicted in accordance with a preferred embodiment of the present invention. Package 600 includes, in this example, openings 602, 604, 606, and 608, which expose a substrate or other area with pads or other connectors for a semiconductor device, such as a bare memory die flip chip or memory CSP packages. In this example, the openings include cutouts in the copper stiffener to expose the substrate. These cutouts are in places in which the exposed portions of the substrate contain contacts or other mechanisms for providing an electrical connection between the substrate and a die.

Figure 7:
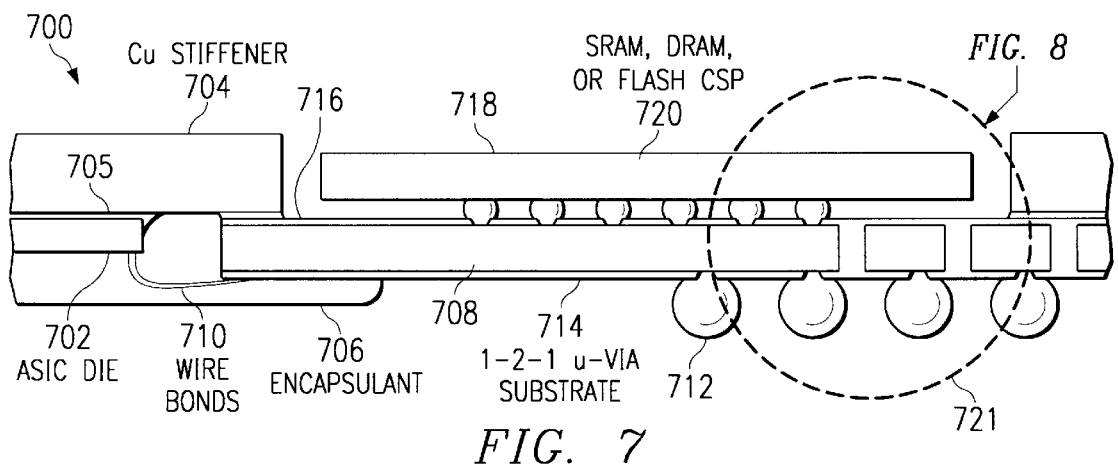
FIG. 7 is a cross-section of a multi-chip module depicted in accordance with a preferred embodiment of the present invention.

With reference now to FIG. 7, a cross-section of a multi-chip module is depicted in accordance with a preferred embodiment of the present invention. In this example, package 700 is a cavity down, thermally enhanced PBGA package. Package 700 contains an ASIC die 702, which is attached to a copper stiffener 704. In turn, ASIC die 702 is encapsulated by encapsulant 706. ASIC die 702 is connected to a substrate 708 via wire bonds 710. ASIC die 702 may be mounted to copper stiffener 704 by the way of an adhesive material 705. Adhesive material 705 may be, for example, an epoxy adhesive, a soft solder, or any other adhesive material suitable for mounting a die to copper stiffener 704. Depending on the design, adhesive 705 may be electrically conductive or non-conductive. Wire bonding is used to make electrical connections between electrical contacts in ASIC die 702 and electrical contacts on substrate 708. In this example, substrate 708 is a micro via substrate with solderballs 712, which provide an electrical connection to a PCB. Substrate 708 may be, but is not limited to, ceramic, metal, silicon, or a plastic circuit board material. Multi-layer ceramic substrates are often used because of convenience and availability. Metal substrates may be used because of the toughness compared to multi-layer ceramic substrates, high strength, inexpensive, and high thermal conductivity. Further, these substrates may be multi-layer metal substrates, such as copper-invar-copper or copper molybdenum-copper.

Solderballs 712 include connections to metal layer 714, which provides for power and I/O connections to ASIC 702. Further, substrate 714 also includes a middle layer 716, which is exposed within opening 718 in package 700. The metal layer is on the top side of package 700 and provides a place in the top of package 700 for connecting or placing a device 720, such as a SRAM, DRAM, or flash CSP in accordance with the preferred embodiment of the present invention. Of course, other types of CSPs or other types of semiconductor devices may be placed within opening 718. Middle layer 716 may be patterned to provide a bus for device 720 to provide a connection to power and I/O on a PCB connected to solderballs 712. A more detailed illustration of section 721, illustrating the interconnection between device 720 and substrate 708, may be found in FIG. 8.

Figure 8:
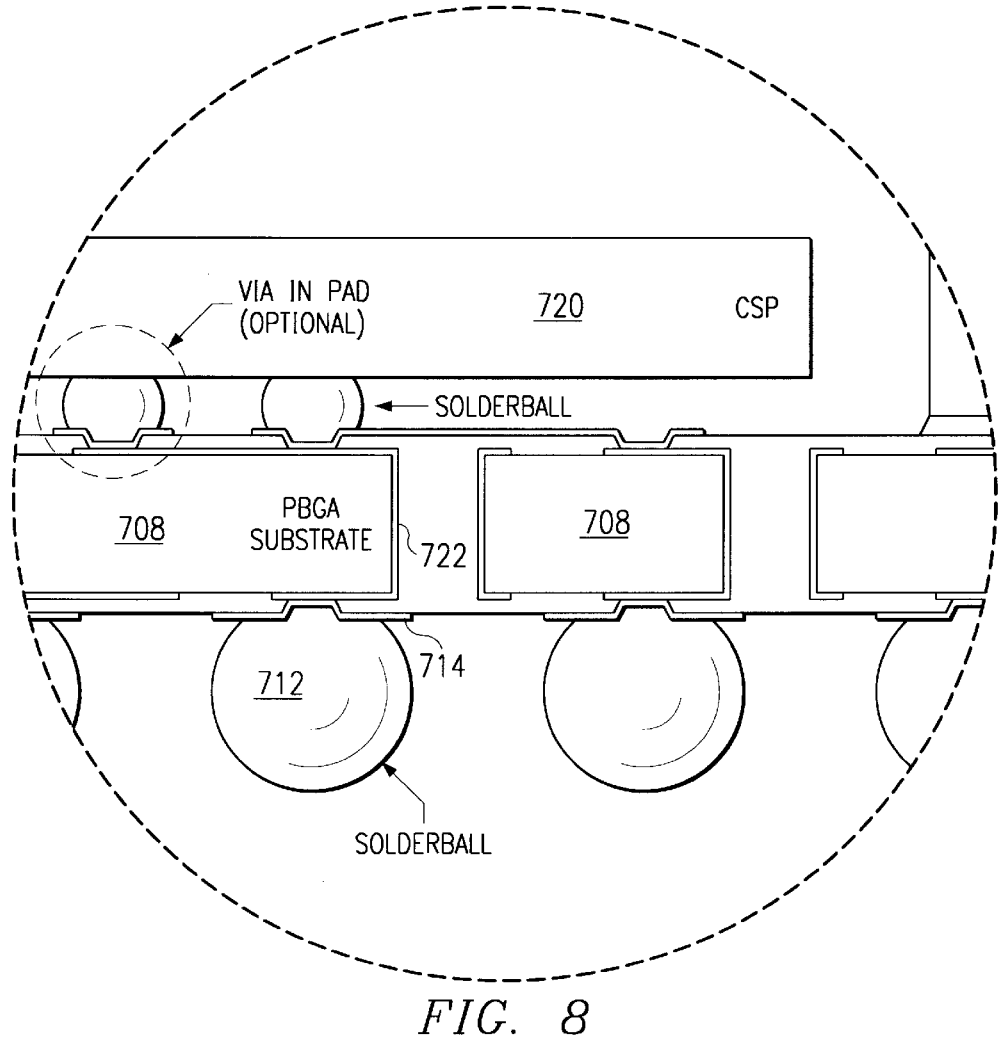
FIG. 8 is a more detailed illustration of a micro via substrate and various connections used in providing access to a memory or other devices depicted in accordance with a preferred embodiment of the present invention.

With reference now to FIG. 8, a more detailed illustration of a micro via substrate and various connections used in providing access to a memory or other device attached to package 700 is depicted in accordance with the preferred embodiment of the present invention. As can be seen, solderballs 712 include a connection to metal layer 714 within substrate 708. As can be seen, solderballs 712 provide a connection between metal layers 714 and a PCB while solderballs provide a connection between device 720 and metal layer 716. Microvia substrate 708 also includes a metal layer 722, which provides interconnection between middle layer 716 and 714. This connection mechanism allows for power and I/O to be supplied to device 720 in addition to ASIC 702 in FIG. 7.

In this manner, devices may be attached to package 700 at a later point in time to add additional memory capability or additional processing capability to a MCM. These devices may be even added after the chip has been implemented on an adapter and placed in a computing device and in actual use. The present invention provides for greater memory access within a data processing system through allowing access memory by additional devices.

Thus, the present invention provides an improved package architecture in which flexibility is allowed for adding additional devices to a chip after the chip has been manufactured. Openings in the chip package to expose one or more areas of the substrate in which connections are configured for allowing attachment of additional die is one feature of the present invention providing flexibility and allowing for increasing yields in producing chips. Further, the architecture of the present invention also provides an ability for off-chip devices to access the secondary die, which may be added to the chip package. This advantage is especially useful in the instance in which the secondary dies are memory devices. This allows for greater flexibility and availability of memory when using such chips in a data processing system.

The description of the preferred embodiment of the present invention has been presented for purposes of illustration and description, but is not intended to be exhaustive or limited to the invention in the form disclosed. Many modifications and variations will be apparent to those of ordinary skill in the art. Although the example illustrated in a preferred embodiment of the present invention is a multi-chip module with a cavity down, thermally enhanced plastic ball grid array assembly package, other types of packages may be employed using the features and advantages of the present invention. The embodiment was chosen and described in order to best explain the principles of the invention the practical application to enable others of ordinary skill in the art to understand the invention for various embodiments with various modifications as are suited to the particular use contemplated.

What is claimed is:

1. A circuit assembly comprising:

a substrate;

a first set of contacts;

a second set of contacts;

a third set of contacts;

a plurality of electrically conductive lines located on the substrate providing electrical connection between the first set of contacts, the second set of contacts, and the third set of contacts, wherein the plurality of electrically conductive lines are configured such that data can be transferred between the first set of contacts, the second set of contacts, and the third set of contacts;

a first die electrically connected to the first set of contacts; and an enclosure surrounding the substrate, wherein the enclosure is formed such that the second set of contacts is exposed allowing electrical connection of a second die to the second set of contacts.

2. The circuit assembly of claim 1, wherein the first set of contacts are located on a first side of the substrate while the second set of contacts are located on a second side of the substrate opposite to the first side.

3. The circuit assembly of claim 1, wherein the substrate includes a copper stiffener and wherein the first die is mounted on the copper stiffener.

4. The circuit assembly of claim 1, wherein the circuit assembly is a plastic ball grid array assembly.

5. The circuit assembly of claim 1, wherein the first die is an application specific integrated circuit.

6. The circuit assembly of claim 1, wherein the second die is a memory die.

7. The circuit assembly of claim 1, wherein the second die is a flip chip.

8. The circuit assembly of claim 1, wherein the second die is located in a chip scale package.

9. The circuit assembly of claim 1, wherein the second die is a direct chip attach die.

10. The circuit of claim 1, wherein the enclosure is a molding compound.

11. The circuit of claim 1, wherein the enclosure is a copper stiffener.

12. A circuit assembly comprising:
a substrate;
a bus formed from a plurality of conductive lines located on the substrate;
a first integrated circuit attached to the substrate and electrically connected to the bus;
a die connector electrically connected to the bus, wherein the die connector provides a point for an electrical connection of a second integrated circuit to the bus;
an input/output connector electrically connected to the bus, wherein the second connector provides a point for electrical connection to the bus; and
an enclosure enclosing the substrate, wherein a portion of the substrate containing the die connector is exposed to allow for physical and electrical attachment of the second integrated circuit to the die connector.

13. The circuit assembly of claim 12, wherein the die connector is located on a first side of the substrate and wherein the input/output connector is located on a second side of the substrate opposite to the first side.

14. The circuit assembly of claim 13, wherein input/output connection includes a plurality of terminals configured for connection to a printed circuit board.

15. The circuit assembly of claim 14, wherein the plurality of terminals comprise a plurality of solderballs.

16. The circuit assembly of claim 13, wherein the die connector is configured to receive a chip scale package.

17. The circuit assembly of claim 13, wherein the die connector is configured to receive a flip chip.

18. The circuit assembly of claim 13, wherein the first integrated circuit is an application specific integrated circuit.

19. The circuit assembly of claim 13, wherein the second integrated circuit is a memory.

20. The circuit assembly of claim 13, wherein the second integrated circuit is a application specific integrated circuit.

21. The circuit assembly of claim 13, wherein the bus is configured such that the first integrated circuit and an external device connected to the input/output connector access the second integrated circuit through the bus.

* * * * *